(12) United States Patent
Hu et al.

(10) Patent No.: US 11,948,858 B2
(45) Date of Patent: Apr. 2, 2024

(54) HIGH THERMAL CONDUCTIVITY BORON ARSENIDE FOR THERMAL MANAGEMENT, ELECTRONICS, OPTOELECTRONICS, AND PHOTONICS APPLICATIONS

(71) Applicant: THE REGENTS OF THE UNIVERSITY OF CALIFORNIA, Oakland, CA (US)

(72) Inventors: Yongjie Hu, Los Angeles, CA (US); Joon Sang Kang, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 465 days.

(21) Appl. No.: 16/967,362

(22) PCT Filed: Feb. 1, 2019

(86) PCT No.: PCT/US2019/016255
§ 371 (c)(1),
(2) Date: Aug. 4, 2020

(87) PCT Pub. No.: WO2019/152782
PCT Pub. Date: Aug. 8, 2019

(65) Prior Publication Data
US 2021/0035885 A1  Feb. 4, 2021

Related U.S. Application Data

(60) Provisional application No. 62/694,344, filed on Jul. 5, 2018, provisional application No. 62/626,471, filed on Feb. 5, 2018.

(51) Int. Cl.
*H01L 23/373* (2006.01)
*C30B 25/02* (2006.01)
(Continued)

(52) U.S. Cl.
CPC .......... *H01L 23/3738* (2013.01); *C30B 25/02* (2013.01); *C30B 29/40* (2013.01);
(Continued)

(58) Field of Classification Search
None
See application file for complete search history.

(56) References Cited

U.S. PATENT DOCUMENTS

2013/0207214 A1    8/2013  Haddad et al.
2014/0209168 A1*   7/2014  Zhamu ................ H01L 31/052
                                                    428/323
(Continued)

FOREIGN PATENT DOCUMENTS

WO    WO-2009/023045 A2    2/2009
WO    WO-2009/152503 A2    6/2009

OTHER PUBLICATIONS

Chu, "Boron Arsenide and Boron Phosphide for High Temperature and Luminescent Devices", Final Technical Report, p. 10, pp. 41-44, p. 52 (Jul. 1, 1969-Aug. 31, 1975).
(Continued)

*Primary Examiner* — Nilufa Rahim
(74) *Attorney, Agent, or Firm* — Foley & Lardner LLP

(57) ABSTRACT

A device includes: (1) a boron arsenide substrate; and (2) an integrated circuit disposed in or over the boron arsenide substrate.

18 Claims, 8 Drawing Sheets

(51) Int. Cl.
    *C30B 29/40*     (2006.01)
    *H01L 21/02*     (2006.01)
    *H01L 29/20*     (2006.01)

(52) U.S. Cl.
    CPC .. *H01L 21/02392* (2013.01); *H01L 21/02546* (2013.01); *H01L 21/02598* (2013.01); *H01L 21/0262* (2013.01); *H01L 29/20* (2013.01)

(56) References Cited

U.S. PATENT DOCUMENTS

| | | |
|---|---|---|
| 2015/0362265 A1 | 12/2015 | Broido et al. |
| 2017/0175290 A1 | 6/2017 | Chen et al. |
| 2022/0415743 A1* | 12/2022 | Eid .................... H01L 21/50 |
| 2023/0048534 A1* | 2/2023 | Vafai ................ H01L 23/3672 |
| 2023/0257907 A1* | 8/2023 | Ren ..................... C30B 29/40 |
| | | 428/220 |

OTHER PUBLICATIONS

International Search Report and Written Opinion, issued in Int'l. Appln. No. PCT/US2019/016255, 8 pages (dated May 7, 2019).
International Preliminary Report on Patentability on PCT/US2019/016255 dated Aug. 20, 2020 (2 pages).

* cited by examiner

HIGH THERMAL CONDUCTIVITY BORON ARSENIDE FOR THERMAL MANAGEMENT, ELECTRONICS, OPTOELECTRONICS, AND PHOTONICS APPLICATIONS

CROSS-REFERENCE TO RELATED APPLICATIONS

This application is a National Stage Entry of International Application No. PCT/US2019/016255, filed Feb. 1, 2019, which claims the benefit of U.S. Provisional Application No. 62/626,471, filed Feb. 5, 2018, and the benefit of U.S. Provisional Application No. 62/694,344, filed Jul. 5, 2018, the contents of which are incorporated herein by reference in their entirety.

TECHNICAL FIELD

This disclosure generally relates to boron arsenide and its applications.

BACKGROUND

Heat dissipation has become a paramount issue in the electronics and semiconductor industries. High-power circuitry and high density of transistors in integrated circuits increase a temperature of electronic devices ranging from smart phones to data server farms, resulting in overheating of the devices. Heat should be spread quickly for reliable device operation because accumulated heat can significantly decrease device performance and cause device failure. Materials proposed for thermal management applications include aluminum oxide ($Al_2O_3$) and silicon carbide (SiC). However, thermal conductivities of $Al_2O_3$ and SiC are about 35 Watts/meter·Kelvin (W/m·K) and about 300 W/m·K, respectively, which are not adequate for various thermal management applications. Diamond has a high thermal conductivity ($\kappa$ of about 2000 W/m·K). However, diamond suffers from high material cost and difficulty of device integration. It is desired to identify a bulk material with ultra-high thermal conductivity for efficient thermal management.

It is against this background that a need arose to develop the embodiments described herein.

SUMMARY

In some embodiments, a device includes: (1) a boron arsenide substrate; and (2) an integrated circuit disposed in or over the boron arsenide substrate.

In additional embodiments, a device includes: (1) an active or passive component; (2) a heat sink; and (3) a thermal interface material disposed between the active or passive component and the heat sink and including boron arsenide that is single-crystalline.

In additional embodiments, a method of forming boron arsenide includes: (1) providing a growth substrate; and (2) exposing the growth substrate to a first precursor including boron, and a second precursor including arsenic to yield epitaxial growth of boron arsenide over the growth substrate.

In further embodiments, an electronic, optoelectronic, or photonic device includes single-crystalline boron arsenide.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

DETAILED DESCRIPTION

Figure 1:
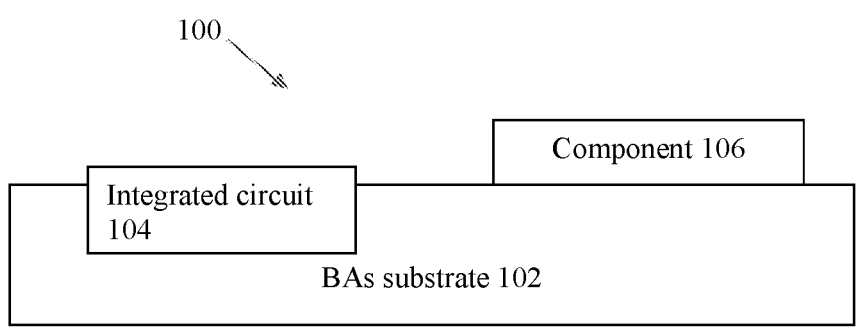
FIG. 1. Schematic of a device according to some embodiments.

Through experimental development of material synthesis and processing, an improved, ultra-high thermal conductivity material is developed, namely boron arsenide (BAs). By using epitaxial growth, high-quality BAs crystals are grown. A room temperature thermal conductivity (298 K) of BAs is measured as about 1300 W/m·K, which places this material among the best thermal conductors among bulk semiconductors or metals. This value is about two times higher than boron nitride and about ten times higher than silicon. With a low cost of material synthesis and processing, BAs can be used for thermal management applications in electronic, optoelectronic, and photonic devices, including computers, smart phones, data server farms, light emitting diodes, lasers, and solar cells.

Some embodiments are directed to material synthesis and processing and integration of a BAs-based material (including in the form of single crystals, polycrystalline, amorphous, or any combination of such forms or as alloys or composites mixed with other materials) for thermal management and other applications.

In some embodiments, a BAs-based material includes BAs that is single-crystalline and is substantially defect free. A defect can refer to any of a point defect (e.g., vacancy or insertion), a line defect (e.g., dislocation), or a planar defect (e.g., grain boundary at an interface between domains having different crystalline orientations). By substantially defect free in some embodiments, it is meant that, within a BAs crystal, there is no greater than $10^3$ defects per crystal, such as no greater than $10^2$ defects per crystal, no greater than 10 defects per crystal, no greater than 1 defect per crystal, or fewer than 1 defect per crystal, and where a size of the crystal can be about 0.2 µm or greater, about 0.5 µm or greater, about 0.7 µm or greater, about 1 µm or greater, about 5 µm or greater, or about 10 µm or greater, and up to about 50 µm or greater, up to about 100 µm or greater, or up to about 500 µm or greater. By substantially defect free in some embodiments, it is meant that, within a BAs crystal, there is no greater than 1 defect per $10^4$ atoms, such as no greater than 1 defect per $10^5$ atoms, no greater than 1 defect per $10^6$ atoms, or no greater than 1 defect per $10^7$ atoms. In some embodiments, BAs that is substantially defect free is manifested or characterized by having a room temperature thermal conductivity of about 1300 W/m·K. In other embodiments, a BAs-based material includes BAs that may include a certain amount of defects, such as manifested or characterized by having a room temperature thermal conductivity less than about 1300 W/m·K, such as about 200 W/m·K or greater and less than about 1300 W/m·K, about 300 W/m·K or greater and less than about 1300 W/m·K, about 400 W/m·K or greater and less than about 1300 W/m·K, about 500 W/m·K or greater and less than about 1300 W/m·K, about 600 W/m·K or greater and less than about 1300 W/m·K, about 700 W/m·K or greater and less than about 1300 W/m·K, about 800 W/m·K or greater and less than about 1300 W/m·K, about 900 W/m·K or greater and less than about 1300 W/m·K, or about 1000 W/m·K or greater and less than about 1300 W/m·K. In some embodiments, a BAs-based material includes BP having a molar ratio of B to As of about 1.

In some embodiments, a BAs-based material is formed by epitaxial growth on a growth substrate. In some embodiments, the growth substrate includes boron. In some embodiments, the growth substrate includes a boron compound. In some embodiments, the growth substrate is a boron phosphide (BP) substrate. In some embodiments, epitaxial growth includes exposure of the growth substrate via chemical vapor transport of a first precursor or reactant and a second precursor or reactant, where the first precursor is, or includes, boron, and the second precursor is, or includes, arsenic. In some embodiments, epitaxial growth is performed under vacuum, such as a pressure of about $10^{-3}$ Torr or less, about $10^{-4}$ Torr or less, or about $10^{-5}$ Torr or less, and in a reaction furnace, such as a temperature of about 800 K or greater, about 900 K or greater, or about 1000 K or greater.

Devices or applications can have a BAs-based material in physical contact or non-physical contact with a heat source, as long as heat is conducted, collected, dissipated or otherwise regulated through the BAs-based material. Examples include computers, mobile devices, and any other devices including circuits or other components that can benefit from heat dissipation or conduction. In addition, thermal applications integrating the BAs-based material in any of its crystalline or structural forms for thermal energy conversion and storage are encompassed by this disclosure. Further, some embodiments are directed to integration of the BAs-based material as a material or device platform for various applications in electronic devices, photonic devices, optoelectronic devices, acoustic devices, sensors, detectors, and so forth.

Examples of devices and applications include:

1) Substrate for Heat Dissipation

With the shrinking of electronic, optoelectronic, and photonic devices down to the nanoscale, heat generation in a nanoscale device becomes an increasingly important technological issue, with a local hot spot reducing device performance and potentially causing device failure. $Al_2O_3$ and SiC are typically used as materials of a substrate. However, instead of using $Al_2O_3$ or SiC, a BAs substrate can serve as a more effective heat sink substrate because BAs has a much higher thermal conductivity and can remove heat efficiently away from a hot spot to increase device performance.

FIG. 1 is a schematic of an electronic, optoelectronic, or photonic device 100 according to some embodiments. The device 100 includes a substrate 102 formed of, or including, BAs. An integrated circuit 104, such as including logic gates, flip-flops, multiplexers, and other circuitry, is formed in or over the BAs substrate 102. The BAs substrate 102 can remove heat efficiently away from a hot spot in the integrated circuit 104. Also shown is an electronic, optoelectronic, or photonic component 106 disposed over the BAs substrate 102 and thermally connected to the BAs substrate 102. The component 106 can be an active component, such as including an integrated circuit, or can be a passive component. The BAs substrate 102 can remove heat efficiently away from a hot spot in the component 106.

2) Thermal Interface Materials

When two different materials contact together at an interface, additional thermal resistance is generated at the interface. In this case, heat transport can be impeded across the interface. A thermal grease, which is a polymer mixed with silver nanoparticles, can be used to enhance heat transport at the interface. However, a thermal conductivity of the thermal grease is still about 1 W/m·K. BAs can be used to increase thermal transport at the interface. If nano-sized BAs is applied at the interface with a polymer, thermal transport at the interface can increase dramatically. Nano-sized BAs can be in the form of nanoparticles formed of, or including, BAs, where the particles have sizes or an average size in a range of about 1 nm to about 1000 nm, about 1 nm to about 900 nm, about 1 nm to about 800 nm, about 1 nm to about 700 nm, about 1 nm to about 600 nm, about 1 nm to about 500 nm, about 1 nm to about 400 nm, about 1 nm to about 300 nm, about 1 nm to about 200 nm, or about 1 nm to about 100 nm. BAs also can be in the form of microparticles, where the particles have sizes or an average size in a range of about 1 μm to about 1000 μm, about 1 μm to about 900 μm, about 1 μm to about 800 μm, about 1 μm to about 700 μm, about 1 μm to about 600 μm, about 1 μm to about 500 μm, about 1 μm to about 400 μm, about 1 μm to about 300 μm, about 1 μm to about 200 μm, or about 1 μm to about 100 μm. BAs also can be in the form of millimeter-sized particles, where the particles have sizes or an average size of about 1 mm or greater, such as up to about 10 mm or greater, or up to about 100 mm or greater.

Figure 2:
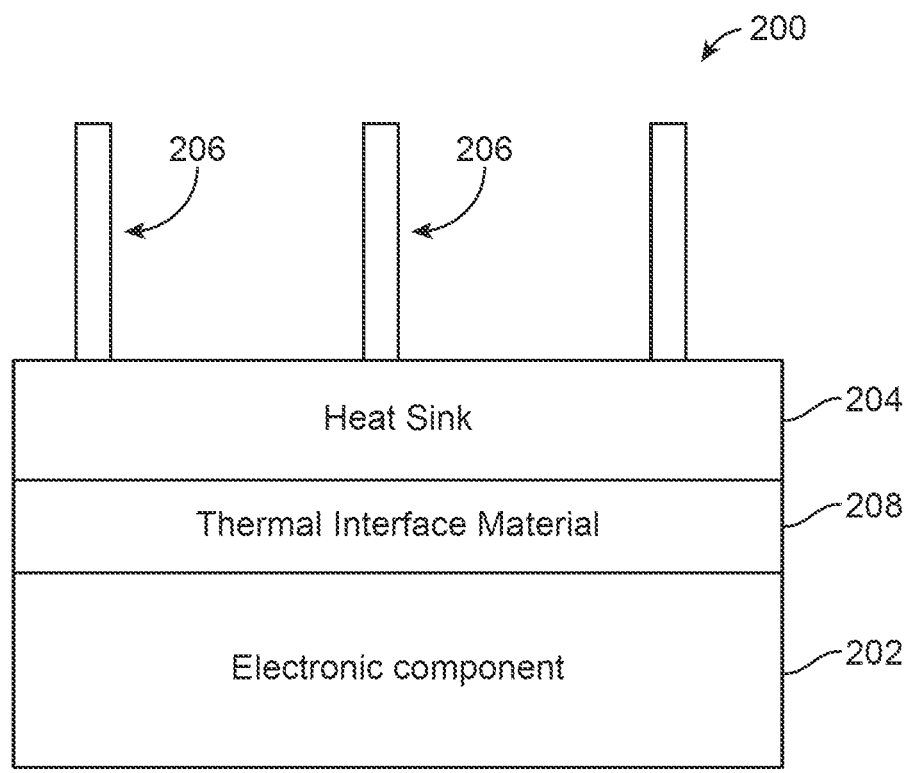
FIG. 2. Schematic of a device according to some embodiments.

FIG. 2 is a schematic of an electronic, optoelectronic, or photonic device according to some embodiments. The device 200 includes an electronic, optoelectronic, or photonic component 202, which can be an active component, such as including an integrated circuit, or can be a passive component. The device 200 also includes a heat sink 204, which serves to dissipate heat generated by the component 202 through a heat spreader 206 included in the heat sink 204, such as including an array of pins or fins. The component 202 is thermally connected to the heat sink 204 via a thermal interface material 208 formed of, or including, BAs, which can be in the form of particles, such as nanoparticles dispersed in a polymer. The polymer can be selected from, for example, epoxies, silicones, urethanes, and acrylates, among other polymers. The BAs-containing interface material 208 can increase thermal transport at the interface between the component 202 and the heat sink 204.

3) Material or Device Platform

In analogy to silicon, a BAs-based material can be integrated as a material or device platform for various applications in electronic devices (e.g., transistors, electronic sensors, circuits, memories, and so forth), photonic devices (e.g., lasers, light-emitting diodes, lighting applications, and so forth), and optoelectronic devices (e.g., photodetectors, optical switches, attenuators, and so forth), as well as applications in which other materials are implemented (e.g., germanium, gallium nitride, gallium arsenide, and so forth). For example, and referring to FIG. 1, either of, or both, the integrated circuit 104 and the component 106 also can include a BAs-based material, which can serve as a channel for transport of charge carriers between a pair of terminal regions. For example, and referring to FIG. 2, the component 202 also can include a BAs-based material.

High-frequency, high-speed, or high-power electronics are desired in modern technologies from smartphone to military radar. Basic criteria for high-frequency and high-power electronic materials are high carrier mobility, wide electronic bandgap, and high thermal conductivity. Because of its high response time in high frequency and power electronics, carrier mobility should be high and bandgap should be wide to mitigate against dielectric breakdown. In addition to these electrical properties of materials, thermal conductivity of materials is also important to high-frequency and high-power electronics. During the device operation with high frequency and high power, significant heat is generated and accumulated inside of a device. The amount of heat generated in the device is related with operation frequency and power. High-frequency and high-power electronics generate significant heat and it can significantly reduce the device performance. To prevent heat generation, a comparative device is operated at much lower frequency and power than its theoretical limit and it is a bottleneck of electronics technology.

Gallium arsenide (GaAs) and gallium nitride (GaN) are used in high-frequency and high-power electronics because of their high carrier mobility and wide bandgap. However, because of their small thermal conductivity, device performance is constrained.

BAs has a high carrier mobility with a wide bandgap. Furthermore, different from other materials such as GaAs and GaN, its thermal conductivity is about one order of magnitude higher than GaAs and GaN, which is about 1300 W/m·K.

Because of its high carrier mobility and its wide bandgap with high thermal conductivity, BAs is an excellent candidate for high-frequency and high-power electronics.

3a) High-Frequency Device

Some embodiments encompass any materials processing or integration to use BAs in any crystalline or structural forms for high-frequency electronic devices. It is included any device operating from Hertz (Hz) frequency to Terahertz (THz) frequency range. Examples include computer, smartphone and military radar. BAs has high electron and hole mobility which is comparable with other materials such as GaAs and GaN. Physically, carrier mobility is a strong function of device temperature and temperature rise in a device is exponentially increased with increasing operation frequency. Because of low thermal conductivity of GaAs and GaN, heat generated during device operation cannot be adequately spread and is accumulated inside of a device, resulting in increased device temperature. Electronic device operation frequency is constrained by this accumulated heat. However, because BAs has high electron and hole mobility with high thermal conductivity which is up to about 25 times and about 7 times higher than GaAs and GaN, BAs can be desirable as a material for high frequency devices. BAs is more stable and can provide higher performance than other materials with reducing temperature rise.

3b) High-Power Electronics

Some embodiments encompass any materials processing or integration to use BAs in any crystalline, amorphous, or other structural forms for high-power electronic devices. BAs has a wide bandgap, a high carrier mobility and an ultra-high thermal conductivity which is desired for high-power electronics. Other materials such as GaAs and GaN have a low thermal conductivity. Because of their low thermal conductivity, operation power in these materials is constrained and is a major roadblock in GaAs and GaN devices. To effectively spread heat during device operation and further increase operation power in GaAs and GaN devices, a heat spreading layer or device by using silicon carbide or synthesized diamond can be used for a substrate to remove heat effectively. These substrate or additional layer of materials increase cost and generate complex device fabrication. However, because BAs itself has a high carrier mobility with a high thermal conductivity, BAs can be used for high-power electronics while omitting additional heat spreading layer and can be operated at much higher power than GaN and GaAs devices. Examples include computers, smartphones and military radar.

EXAMPLE

The following example describes specific aspects of some embodiments of this disclosure to illustrate and provide a description for those of ordinary skill in the art. The example should not be construed as limiting this disclosure, as the example merely provides specific methodology useful in understanding and practicing some embodiments of this disclosure.

Experimental Observation of High Thermal Conductivity in Boron Arsenide

Overview:

With the ever-shrinking device dimensions down to the nanoscale, heat dissipation is becoming one of the most significant technological challenges for modern electronics and photonics. Therefore, high thermal conductivity materials able to efficiently dissipate heat and improve device performance are demanded. Ab initio theory predicts that a compound material, cubic boron arsenide (BAs), may have an exceptionally high thermal conductivity, which is beyond that of most comparative materials and unexpected by selection rules. However, experimental demonstration of such ultra-high conductivity has remained challenging. Here, this example reports the synthesis of single-crystalline BAs substantially free of defects, and experimental observation of a high thermal conductivity of about 1300 W/m·K, placing BAs as a thermal conductor surpassing other bulk metal and semiconducting materials. To better understand the fundamental origin of such ultra-high thermal conductivity, advanced phonon spectroscopy is performed. The measurements, in conjunction with atomistic theory, reveal that, unlike the rule for most materials that the three-phonon process is the sole dominant scattering mechanism, high-order anharmonicity through the four-phonon process is significant in BAs because of its band structure. In addition, the phonon spectra are probed through ballistic transport and it is shown that phonons with very long mean free paths (>about 1 μm) are the major contributors to the BAs thermal conductivity. The results establish BAs as a benchmark material for thermal management, and exemplifies the power of combining experiments and ab initio theory in materials discovery to push the scientific frontiers in energy, electronics, and photonics applications.

Results and Discussion:

Due to the ever-shrinking dimensions of modern electronics, heat dissipation is becoming one of the most significant technological challenges. In 2016, the worldwide semiconductor industry formally acknowledged that Moore's law, which has powered the information technology revolution since 1960s, is nearing its end. A major issue is the enormous amount of waste heat generated during electronic device operation. For example, at the macroscale, the U.S. data center devotes about 50% of its total electricity use to cooling, and at the nanoscale, power density in current transistors exceeds that of the Sun's surface. Indeed, low thermal conductivity and heat dissipation rates severely degrade the performance and energy efficiency of electronic and photonic devices. Thermal management is a significant roadblock for next-generation devices, such as microprocessors and integrated circuits, light-emitting diodes (LEDs), and high-power radio frequency (RF) devices, amongst others.

High thermal conductivity (HTC) materials are demanded for efficient heat dissipation from hot spots and improve device performance. So far, efforts have relied on carbon-based crystals—diamond, graphene, and carbon nanotubes. Diamond, the most developed material for passive cooling of high-power electronics, suffers from high cost, slow synthesis rates, low quality, and challenging integration with semiconductors. Graphene and nanotubes have largely degraded thermal conductivity when assembled into practical sizes, due to ambient interactions and disorder scattering, as well as challenges in their intrinsic anisotropy.

Fundamentally, understanding the origins of HTC remains a significant challenge. The accepted criteria for HTC materials are: (i) simple crystal structure; (ii) low average atomic mass ($M_{av}$); (iii) strong interatomic bonding; and (iv) low anharmonicity. Criteria (ii) and (iii) imply a large Debye temperature (ΘD), and provide the rule of thumb that thermal conductivity decreases with increasing $M_{av}$ and decreasing $\Theta_D$. Diamond is the prototypical crystal. Its two-atom unit cell, light carbon mass, and stiff covalent bonding result in a record-high thermal conductivity value. Recent ab initio calculations have shown excellent agreement with the measured thermal conductivity of a wide range of materials, including silicon, diamond, graphene, and nanotubes. Such calculations provide physical insights into the nature of the phonon thermal transport and the HTC mechanism.

Ab initio theoretical work indicates that the accepted criteria for HTC materials are incomplete and points to additional ones stemming from fundamental vibrational properties that can lead to HTC. These additional criteria applied to binary compounds are: (i) a large mass ratio of constituent atoms; (ii) bunching together of the acoustic phonon branches; and (iii) an isotopically pure heavy atom. The large mass ratio provides a large frequency gap between acoustic and optic phonons (a-o gap). According to materials examined, bunching of the acoustic phonon dispersions tends to occur in crystals with light constituent atoms, such as boron and carbon, where it derives from an unusual interatomic bonding that lacks core p electrons. Criteria (i) and (ii) contribute to unusually weak phonon-phonon scattering and a large intrinsic thermal conductivity, while criteria (i) and (iii) cause relatively weak scattering of phonons by isotopes. In particular, the ab initio theory identifies the III-V zinc blende compound, boron arsenide (BAs), as having an exceptionally HTC of over about 1,000 W/m·K. This predicted HTC exceeds that of most state-of-the-art HTC materials and more than triples that of an industrial HTC standard, namely silicon carbide. BAs possesses an advantageous combination of properties that incorporates both accepted (light boron mass and stiff, substantially pure covalent bonding) and additional criteria (large arsenic to boron mass ratio, bunching together of its acoustic phonon branches, and isotopically pure As (heavy) atom).

Experimental efforts to synthesize and characterize BAs are scarce, and detailed structural characterization and properties of cubic BAs remain desired. Generally, boron-related materials are notably difficult to obtain in dense bulk form. The synthesis of BAs is further complicated by the high volatility of arsenic and the introduced vacancy defects, as well as the possible formation of sub-phases (e.g., $B_{12}As_2$). Thermal measurement on cubic BAs using the time-domain thermoreflectance (TDTR) technique is performed, and a thermal conductivity value of about 190 W/m·K is measured in BAs samples with high density of defects which is far below the theoretical value. Based on subsequent analysis and calculation, defect scattering plays a dominant role in those samples, which makes probing the actual intrinsic thermal conductivity of BAs challenging in the absence of high-quality BAs crystals. For BAs, single-crystalline samples substantially free of defects and its theoretically predicted high thermal conductivity of over about 1000 W/m·K remain to be experimentally demonstrated. Thus, the ab initio theory prediction for BAs still awaits experimental validation.

Here, this example reports the synthesis of single-crystalline BAs substantially free of defects and experimental observation of its ultra-high thermal conductivity. High-quality single-crystalline cubic BAs was synthesized through developing epitaxial growth and a multistep crystallization process (see Supplementary Materials), followed by careful structural characterizations. A high thermal conductivity of about 1300 W/m·K was measured in the BAs crystals, significantly exceeding that of most comparative HTC materials and validating the ab initio prediction of ultra-high thermal conductivity in BAs. To better understand the origin of this record-high thermal conductivity, further investigation is performed of the phonon transport mechanism in BAs crystals through advanced phonon spectroscopy. The findings establish BAs as an emerging benchmark HTC material for thermal management and energy efficiency.

Figure 3A:
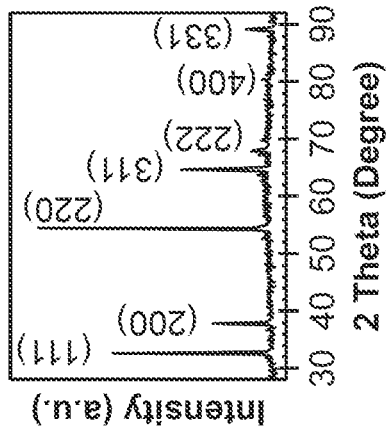
FIG. 3. Structural characterizations of single-crystalline boron arsenide (BAs). (a) Schematic of the zinc-blende crystal structure of cubic BAs, resembling that of diamond. (b) Scanning electron microscopy (SEM) image of BAs. Scale bar: 5 µm. (c) Raman spectra of BAs crystals. (d) Powder X-ray diffraction measurements. (e) Single crystal X-ray diffraction image of BAs. Merged rotational diffraction patterns support a single-crystalline pattern over the entire crystal. (f) Constructed reciprocal lattice of BAs from single-crystal X-ray diffraction measurements, representing a single-crystal reciprocal space. The lattice constant was measured as about 4.78 Å for cubic BAs. (g) SEM image of a BAs sample thin slice (about 100 nm) prepared using focused ion beam for high-resolution transmission electron microscopy (HRTEM) studies. Scale bar: 3 µm. (h) HRTEM image of BAs showing atomically resolved lattices. Inset are two-dimensional Fourier transforms of the image depicting the [111] zone axes of BAs; the arrow indicates the crystal direction of (110). Scale bar: 2 nm.
Figure 3B:
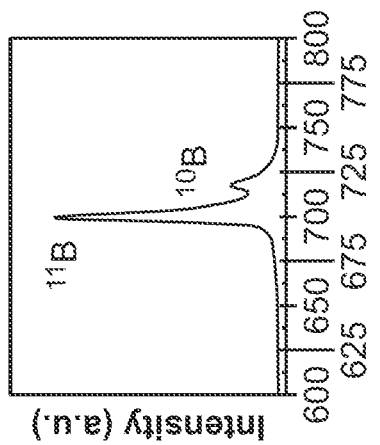
Figure 3C:
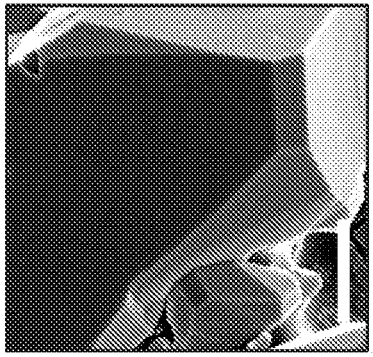
Figure 3D:
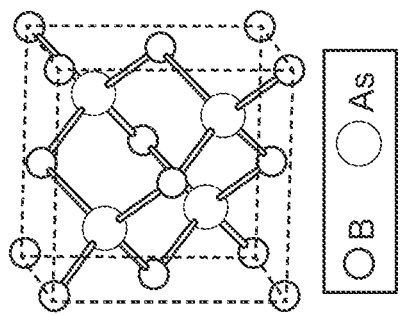
Figure 3E:
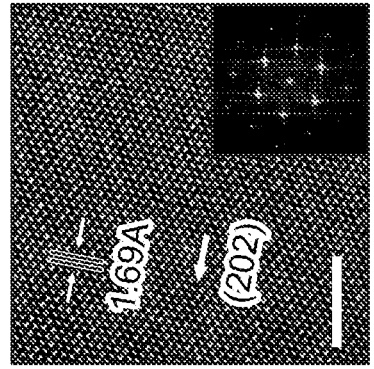

High-Quality Single-Crystalline BAs—BAs has a zinc-blende face-centered cubic (FCC) crystal structure in the F43c space group, where boron and arsenide atoms are interpenetrating and covalently bonded to form a tetrahedral geometry (FIG. 3a). Scanning electron microscopy shows that synthetic BAs crystals are mostly hexagonal in shape (FIG. 3b), representing the orientation-dependent crystallization dynamics. The high-quality single-crystalline structure of the BAs samples was verified by Raman spectroscopy, powder X-ray diffraction (P-XRD), single-crystal X-ray diffraction (S-XRD), and high-resolution transmission electron microscopy (HRTEM). The Raman spectroscopy data (FIG. 3c) clearly shows two peaks, at about 700 and about 720 cm$^{-1}$, corresponding to the optical branches of two boron isotopes ($^{10}$B and $^{11}$B) in the natural abundance, respectively. The observed P-XRD peaks (FIG. 3d) are in agreement with diffractions from different BAs crystal planes. Furthermore, S-XRD was performed to unambiguously verify the single-crystalline nature over entire crystals. BAs samples under X-ray excitation were rotated over 360° and the diffraction data, collected at every about 0.3° rotation, were merged into one plot. S-XRD is a powerful technique to examine the single-crystalline structure over an entire sample. The single-crystalline quality achieved here for BAs is unprecedented in previous samples, which have defects and grain boundaries. In the merged plot of the S-XRD images of the BAs crystals (FIG. 3e), each diffraction spot appears as a single dot without distortion, meaning that all diffraction patterns obtained through the whole crystal are consistent, thereby confirming that the entire BAs sample has substantially perfect single crystallinity and no observable grain boundaries. The experimentally reconstructed reciprocal lattice images from S-XRD (see [100] plane in FIG. 3f and Supplementary Materials) confirm the zinc-blende FCC structure with a cubic lattice constant of about 4.78 Å, which is consistent with the ab initio theory prediction. The reciprocal lattice verifies one single domain over the entire diffraction data with no observable grain boundaries. The S-XRD studies demonstrate that the entire BAs sample is a substantially perfect single crystal. In addition, the BAs crystal was fabricated into a thin film with about 100 nm thickness using a focused ion beam (FIB) (FIG. 3g) (see Supplementary Materials) for HRTEM studies. HRTEM images (FIG. 3h) demonstrate the atomically-resolved single-crystalline lattice of the BAs sample. The reciprocal lattice peaks obtained from two-dimensional Fourier transforms (2DFT) of the lattice-resolved image (inset to FIG. 3h) can be indexed in the zinc-blende structure of BAs with the zone axes along the [111] direction; the measured distance between each fringe is about 1.69 Å, which is consistent with (22$^-$0) lattice spacing of BAs crystals given the diffraction selection rules. Taken together, these comprehensive structural characterizations confirm that the synthesis of high-quality single-crystalline BAs substantially free of defects is experimentally achieved, thereby ensuring the measurement of the maximal thermal conductivity for the intrinsic BAs lattices.

Figure 4:
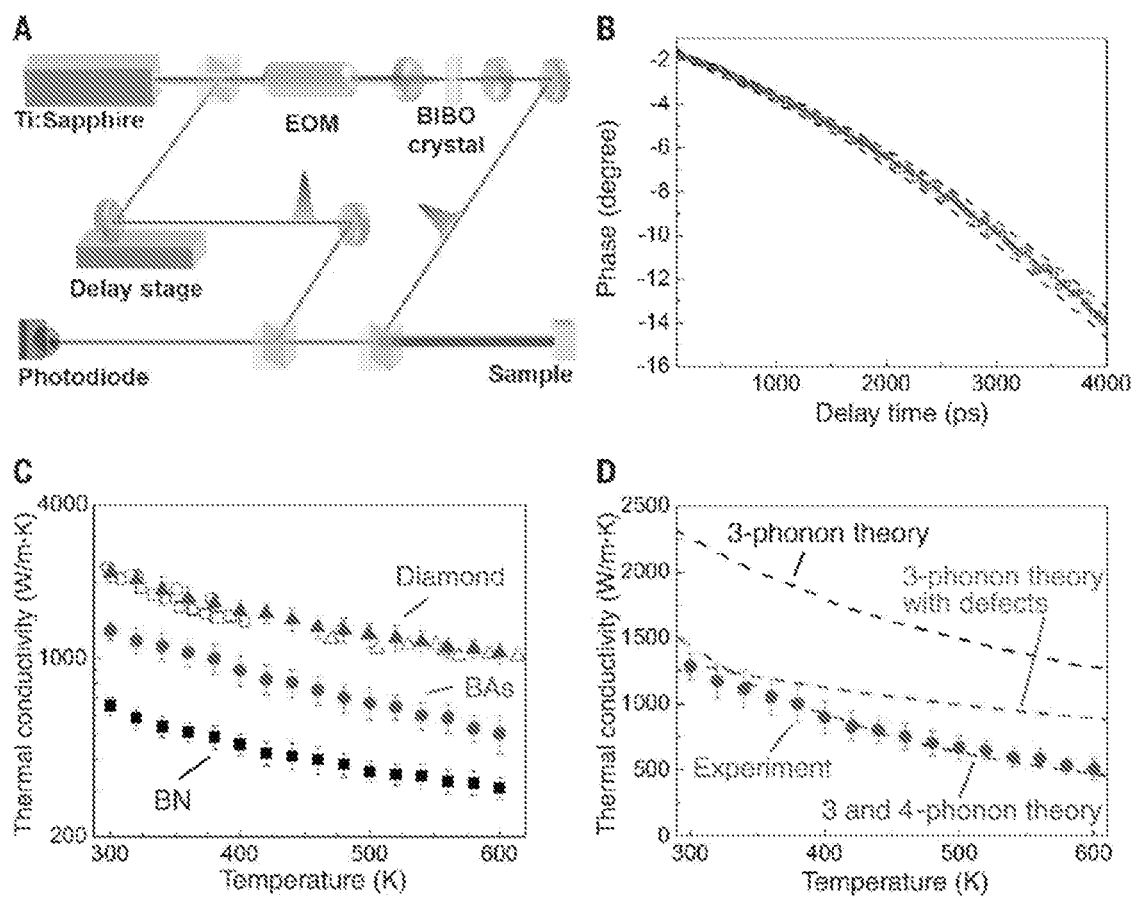
FIG. 4. Temperature-dependent thermal transport measurements. (a) Schematic of a setup for ultrafast pump-probe spectroscopy via the time-domain thermoreflectance (TDTR) technique. (b) Typical TDTR data: thermal reflectance phase signal versus time (circles), fitted to the thermal transport model (line). Calculated curves (dashed lines) using the thermal conductivity changed by about ±10% of the best values to illustrate measurement accuracy. (c) Temperature-dependent (about 300 to about 600 K) thermal conductivity of the three materials with the highest thermal conductivities: diamond, BAs, and boron nitride (BN). Squares, circles and triangles indicate cubic BN, BAs, and diamond, respectively. (d) Experimentally measured thermal conductivity of BAs in comparison to ab initio predictions by density functional theory (DFT), considering either the three-phonon scattering process (labeled dashed line), or the four-phonon scattering process (labeled dashed line).

Benchmark Material with High Thermal Conductivity—To characterize the thermal properties and gain insight into heat conduction of BAs crystals, ultrafast optical pump-probe spectroscopy, based on the TDTR technique, was applied for thermal conductivity measurements and phonon transport studies. TDTR is well-suited to study BAs crystals of finite size, since no physical contact with the sample is involved and the measurements can be performed with a high spatial resolution down to the optical diffraction limit (e.g., sub-micrometer). For TDTR measurements (FIG. 4a), the pump laser beam composed of a train of short pulses that create a rapid temperature rise at the sample surface. The transient temperature decay, caused by the heat impulse, is monitored with another probe pulse that is delayed in time with respect to the pump using a mechanical delay stage. The thermal conductivity is obtained by fitting the full transient decay curve, acquired by varying the time delay, to a thermal model. FIG. 4b shows typical experimental data from the TDTR measurements and fittings. The room-temperature thermal conductivity of the high-quality BAs crystals was measured at about 1300 W/m·K, which exceeds that of other metals and semiconductors, and is more than about three times higher than that of the industrial HTC standards, namely copper and silicon carbide.

To ensure measurement accuracy and provide a direct comparison between other benchmark HCT materials, TDTR measurements were performed simultaneously on single-crystalline BAs, diamond, and cubic boron nitride (BN) samples (see Supplementary Materials). The temperature-dependent thermal conductivity of these samples was measured from about 300 to about 600 K (FIG. 4c). The thermal conductivities measured for diamond and BN are consistent with reported values, verifying the high accuracy of the TDTR measurements, and thereby validating the measurement conditions used for these HTC materials. The measured thermal conductivities of BAs, diamond, and BN increase with reduced temperature, due to the suppression of phonon scattering, indicating a high single-crystalline quality with minimum defects. Remarkably, the thermal conductivity of BAs is almost twice that of cubic BN, making BAs the second highest thermal conducting material among other bulk materials on Earth. Considering its semiconductor nature and high potential for manufacturing integration, BAs holds great promise for thermal management applications. BAs, as a demonstrated HTC benchmark material with HTC, prompted further exploration of the fundamental HTC transport mechanism in order to address two questions raised by atomistic theory regarding the origin of HTC, as discussed below.

Fundamental Origin of Ultra-High Thermal Conductivity—Fundamentally, thermal transport in solids can be described by the interactions of phonons, namely the quantum mechanical quantization modes or quasi-particles of lattice vibrations. Thermal conductivity results from phonon scattering processes that are closely related to the structure of materials. Phonon scattering usually includes Umklapp phonon-phonon scattering ($\tau_U$), phonon-electron scattering ($\tau_{ph-e}$), mass fluctuation scattering ($\tau_M$), and boundary scattering ($\tau_B$) that can be characterized by the following relaxation rate $1/\tau$ ($\tau$ is the corresponding relaxation time):

$$\frac{1}{\tau} = \frac{1}{\tau_U} + \frac{1}{\tau_{ph-e}} + \frac{1}{\tau_M} + \frac{1}{\tau_B} \quad (1)$$

The last two terms of this equation—$\tau_M$ and $\tau_B$—play important roles in the thermal conductivity of crystals with defects and grain boundaries. $\tau_{ph-e}$ is non-negligible for doped semiconductors, or metals with sufficiently high electron density. Importantly, the first term of the equation—$\tau_U$—describes the thermal conductivity of substantially perfect single crystals without defects, and therefore is expected to be the dominant transport mechanism in high-quality BAs single crystals. However, a persistent fundamental question regarding the high-order phonon anharmonicity, in particular for BAs, remains in the field of atomistic phonon theory. Thermal transport in solids is considered to be governed by the three-phonon scattering process, and the effects of four-phonon and higher-order scattering processes are believed to be negligible, since they have a low probability to establish scattering configurations. The three-phonon scattering is deployed in the initial ab initio calculations of the BAs thermal conductivity, but according to recent theory, the four-phonon scattering is important in certain materials such as BAs; the two density functional theories (DFTs) predict different thermal conductivity values for BAs. Here, comparison is made of experimental measurements at different temperatures with two DFT theory predictions (FIG. 4d). It is found that the experimental results are in good agreement with the four-phonon DFT calculation, verifying that, for substantially perfect crystals, the Umklapp phonon scattering dominates phonon interactions. More importantly, the experiments indicate that, unlike other materials, the probability of higher-order phonon scattering in BAs is significant and cannot be ignored. The high-order anharmonicity observed for BAs is caused by its band structure (e.g., large a-o gap and a large mass ratio) that leads to an extremely weak three-phonon process, and provides sufficient numbers of possible four-phonon scattering configurations.

Another important phonon mechanism for HTC in BAs is its phonon mean free path (MFP) spectra that arise from its phonon band structure. MFPs represent the characteristic lengths corresponding to the distance over which heat carriers transmit thermal energy before being scattered; in general, MFPs can span several orders of magnitude—usually from about 1 nm to about 1 mm. According to the ab initio theory, BAs has a large phononic band gap between acoustic and optical phonon branches, which minimizes acoustic-optical phonon scattering and leads to MFPs longer than those of other materials. In particular, BAs phonons with MFPs longer than about 1 μm contribute to more than about 90% of its total thermal conductivity. By comparison, for diamond and cubic BN, phonons with MFPs longer than about 1 μm contribute to about 30% of their total thermal conductivity. To gain further insight and verify the phonon MFP distribution in BAs, the phonon spectral contribution is probed through exploiting the size-dependent ballistic transport. In essence, thermal conductivity represents the spectral contribution from many different phonon modes, and can be quantified using the cumulative thermal conductivity expressed as:

$$\kappa(\Lambda_m) = \int_0^{\Lambda_M} \frac{1}{3} C \cdot v \cdot \Lambda \left(\frac{d\Lambda}{d\omega}\right)^{-1} d\Lambda \quad (2)$$

where C, v, and $\Lambda$ are the phonon mode ($\omega$) dependent heat capacity, group velocity, and phonon MFP, respectively. The cumulative thermal conductivity—$\kappa(\Lambda\Lambda_m)$—represents the contribution to the total thermal conductivity from all phonons with MFPs shorter than a certain value, $\Lambda_m$. This quantitative spectral information projects the contributions to thermal conductivity into characteristic length scales and is used to understand thermal properties in connection with atomistic phonon theory.

Figure 5:
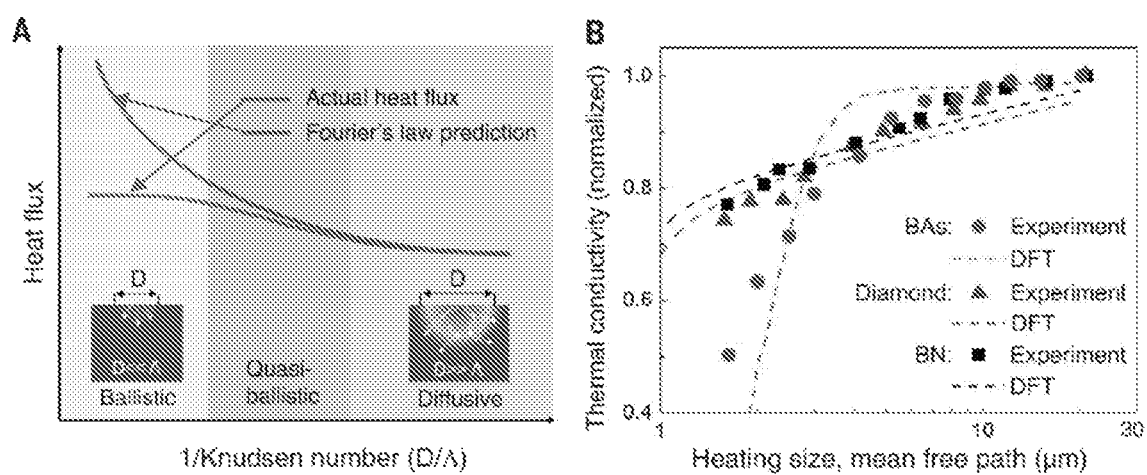
FIG. 5. Probing phonon mean free path spectra of BAs through size-dependent ballistic transport. (a) Schematic of heat flux as a function of the Knudsen number. Labeled lines indicate the actual heat flux and the flux predicted by Fourier's law, respectively. Insets show that the thermal transport evolves from a diffusive to a ballistic regime when the heating size is gradually reduced. When the actual heat flux was measured and fitted to Fourier's law to obtain an effective thermal conductivity ($\kappa_{eff}$), a gradual reduction in $\kappa_{eff}$ is observed with a decreasing heating size. Essentially, the $\kappa_{eff}$ decrease is due to the evolution from diffusive to ballistic transport for the phonons with a mean free path comparable to the heating size, and thereby represents the phonon mean free path spectra. (b) The normalized effective thermal conductivity was measured for the three best thermal conductors (BAs, diamond, and BN), as a function of heating sizes from about 21 to about 1.6 µm. Experimental results, compared with the mean free path spectra calculated with DFT, indicate that in BAs, due to its unusual band structure, a significant portion of phonons have long mean free paths.

Experimentally, this phonon MFP distribution information can be investigated by exploiting the ballistic (or non-equilibrium) heat conduction around a small heating area with thermal spectral mapping spectroscopy technique. FIG. 5a shows the physical concept of such a non-equilibrium thermal measurement. In this measurement, hot phonons travel from the heated area into the underlying substrate material. The heat transfer regime is controlled by a characteristic thermal length, which is proportional to the heating size D, in comparison to phonon MFPs. In the diffusive limit, when D>>$\Lambda$, propagating phonons experience enough scattering to reach local thermal equilibrium. In this case, Fourier's law accurately describes the transport and heat flux, and the thermal conductivity of materials is the bulk value ($\kappa_{bulk}$). From the kinetic theory, the contribution to the total thermal conductivity from a specific phonon mode is $\kappa_{\omega,bulk} = \frac{1}{3} C_\omega \cdot v_\omega \cdot \Lambda_\omega$. As the heater size D decreases, phonons with D<$\Lambda$ will have fewer opportunities to scatter. In the ballistic limit (D<<$\Lambda$), phonons propagate analogously to the thermal radiation over the whole region with a characteristic length of about D. Therefore, the actual heat flux will deviate from the Fourier's law prediction for the quasi-ballistic, or ballistic regimes (FIG. 5a). Mathematically, the actual heat flux is measured and fitted to Fourier's law to obtain an effective thermal conductivity ($\kappa_{eff}$), which gradually decreases in value for smaller Ds, as a higher portion of phonons evolves from diffusive to ballistic transport. The decrease in $K_{eff}(D)$ represents MFP spectra and should follow the same trend in $\kappa(\Lambda_m)$. Although the exact relationship between $\kappa_{eff}$ and D specifies careful atomistic and multi-scale simulations, and is a function of the heating geometry and materials, the size-dependent thermal conductivity measurement can provide a fundamental understanding of such MFP spectra.

In the experiments, the laser beam served as the heater and measurement is made of the effective thermal conductivity of materials by varying the laser heating size from about 21 to about 1.6 μm. The thermal conductivity of BAs, diamond, cubic BN were measured simultaneously as a function of the heating sizes (FIG. 5b). The results show that ballistic transport is clearly observed in all three materials, but that their thermal conductivity decreases differ. For diamond and cubic BN, $K_{eff}$ decreases by about 26% and about 23%, respectively, when reducing the laser heating size from about 21 to about 1.6 μm. By comparison, under the same conditions, a strong thermal conductivity reduction of about 50% is observed for BAs, indicating that long MFP phonons contribute significantly more to heat conduction in BAs crystals. The measurements (FIG. 5b) are consistent with the DFT-predicted results for these materials. Phonons with long phonon MFPs (about 1 to about 10 µm) contribute to a very high portion of BAs' total thermal conductivity (>about 50%). By comparison, in most other materials, phonon MFPs are distributed over a wider range (about 1 nm to about 1 mm). Thus, demonstration is made that the ultra-high thermal conductivity of BAs originates from the enhanced MFPs resulting from its phonon band structure.

In summary, experimental observation is made of an ultra-high thermal conductivity of about 1300 W/m·K at room temperature in synthetic high-quality single-crystalline BAs. The study verifies the ab initio theory prediction and establishes BAs as a benchmark material with the highest isotropic thermal conductivity among bulk metals and semiconductors. The temperature-dependent data indicates that, unlike other materials, high-order phonon anharmonicity strongly affects heat conduction in BAs. Furthermore, the phonon spectral contribution to thermal conductivity, investigated by exploiting the ballistic thermal transport, shows that, in comparison to other materials, long phonon MFPs in BAs contribute to a significantly higher portion of the thermal conductivity. The experimental observation of BAs' ultra-high thermal conductivity highlights its potential as a material platform, for thermal management of electronics and photonics. The investigation of fundamental transport mechanisms represents a benchmark in advancing the experiment-theory synergy for the rational design of materials.

Supplementary Materials:
Materials and Methods
Material Synthesis and Sample Preparation High-quality single-crystalline boron arsenide (BAs) was prepared through chemical vapor transport. To reduce defects and built-in stress introduced by lattice mismatch and thermal expansion, single-crystalline cubic boron phosphide (BP) was used as a growth substrate. Details for synthesis and preparation of high-quality single-crystalline BP are described in J. S. Kang, H. Wu, Y. Hu, Thermal properties and phonon spectral characterization of synthetic boron phosphide for high thermal conductivity applications, *Nano Lett.* 17, 7507-7514 (2017), which is incorporated herein by reference. High-purity boron and arsenic coarse powders (about 99.9999% purity, from Alfa Aesar) were ground by using mortar and pestle, prior to introduction into a quartz tube at a stoichiometric ratio of about 1:2. After loading the reaction sources, the quartz tube was evacuated and flame sealed under high vacuum (about $10^{-5}$ Torr) before placement into a customized three-zone reaction furnace with an about 1083 K hot zone, an about 1058 K center zone and an about 1033 K cold zone. After about 5 weeks at these temperatures, the quartz tube and its content were slowly cooled down to room temperature. These reaction stages were repeated until BAs single crystals of high quality were obtained. For thermal measurements, BAs samples were loaded together with single-crystalline cubic boron nitride (BN) and diamond samples (from Element Six) into a cryostat (Janis ST-100 Optical Cryostat, from 4 to 800K) with a precise proportional-integral-derivative (PID) temperature controller (Lakeshore Model 335). Simultaneous thermal conductivity measurements on the three materials with the highest thermal conductivity, namely BAs, diamond, and BN, were performed with the time-domain thermoreflectance (TDTR) technique (see Thermal Transport Measurements section below) to ensure measurement accuracy for high conducting materials, and allow direct comparisons between them to understand the phonon physics. For each measurement temperature, once the set temperature was reached, an additional waiting time of over about 30 minutes was added before the actual thermal measurement was performed to ensure that the samples had reached a substantially complete thermal equilibrium and steady temperature.

Structural Characterizations

1. X-Ray Diffraction (XRD) Measurements

Powder XRD was conducted with a Panalytical X'Pert Pro XRD machine with a Cu Kα radiation source. Samples of BAs crystals were gently separated from the growth substrate and transferred to the zero-diffraction substrate. The diffractometer was operated at about 45 kV and about 40 mA. After measurement, the diffraction peaks were matched with the material data directory and identified as BAs crystals.

Figure 6:
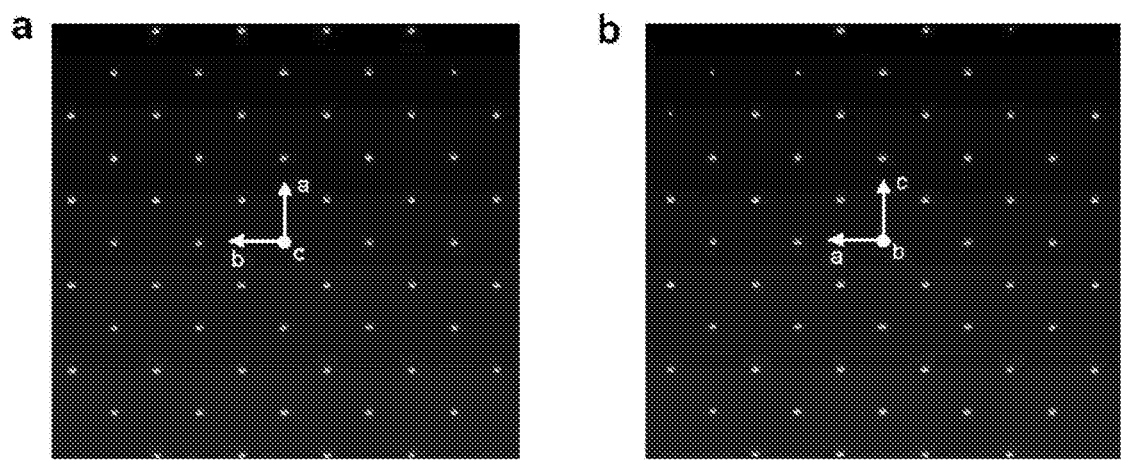
FIG. 6. Verification of crystal quality of BAs. The reciprocal lattice of BAs crystal sample measured from single-crystal X-ray data for the (001) plane (a), (010) plane (b), and (100) plane (FIG. 3c), validates that the entire BAs crystal sample is substantially a single-crystalline domain without any observable impurities or lattice twinning.

Single-crystal XRD was performed using a Bruker SMART APEX II single-crystal XRD machine equipped with a charge-coupled device (CCD) detector. A single piece of BAs crystal (about 50 µm in size) was separated from the growth substrate and mounted onto the goniometer stage for measurement. First, the crystal quality was carefully examined by full-angle rotation images. The BAs sample was rotated over 360 degrees under X-ray excitation, while the diffraction data was continuously collected by the CCD detector and subsequently combined into a single plot. The combined rotation images showed that the BAs crystal sample was a single crystal in its entirety. Next, to determine the unit-cell crystal structure and examine the possibility of any crystal twinning and defects, single-crystal XRD data were collected with about 0.3 degree of frame width and about 60 s/frame of exposure time. A Mo Kα radiation source was used for data collection. Following the measurements, the Bruker APEX software was used to determine the lattice constant and crystal structure. The BAs crystal sample demonstrated a substantially perfect zinc-blende FCC crystal structure with a lattice constant of about 4.78 Å. In combination with the measured diffraction patterns from each frame, the reciprocal lattice space (k space) of the BAs crystal sample was constructed and plotted (FIG. 6). FIGS. 6a and 6b show the measured reciprocal lattice of the BAs crystal in the (001) and (010) direction, respectively. After verification of the crystallographic direction in the reciprocal lattice, it is concluded that the entire BAs crystal was a substantially homogeneous single-crystal domain without any observable impurity or lattice twinning.

2. Transmission Electron Microscopy (TEM) Measurement

TEM samples were prepared by using a focused ion beam (FIB) machine (Nova 600, FEI). First, a single piece of BAs crystal was cut by FIB into small size pieces: about 8 µm×8 µm×2 µm (width×height×thickness), and placed on top of a TEM grid (PELCO FIB Lift-Out, Ted Pella) with a nano-manipulator. The BAs crystal was further milled by FIB until the sample thickness was thin enough (<about 100 nm) to be traversed by the electron beam for effective TEM imaging. After FIB, concentrated argon ion beam (Nanomill, model 1040, Fischeone) is used to clean the BAs sample surface. After cleaning, a high angle annular dark field (HAADF) image is acquired by using aberration-corrected high-resolution scanning TEM (Grand ARM, JEOL, 300 kV). Atomic-resolution TEM images and their fast Fourier transform images were processed with the Gatan TEM software.

3. Raman Spectroscopy

Raman spectra were taken with a Raman microscope (inVia, Renishaw) under laser excitation at about 633 nm with an about 1800/mm grating. The laser was polarized and backscattered and the Raman microscope operated with the Leica DM2500 optical system.

Thermal Transport Measurements

Figure 8:
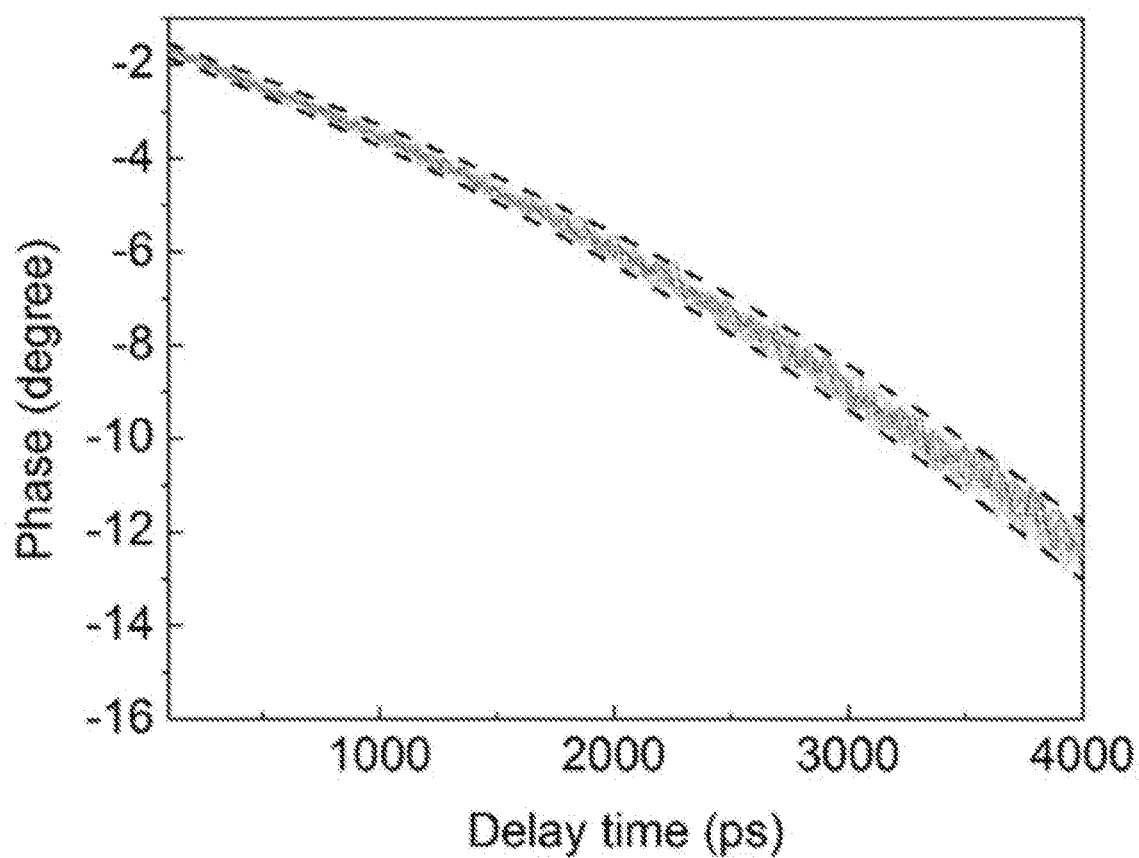
FIG. 8. Ten representative TDTR measurement curves (solid lines) are shown. The dashed curves are calculated using the thermal conductivity changed by about ±10%.

The details of the TDTR measurements are as follows. A titanium (Ti):Sapphire oscillator (Tsunami, Spectra-Physics) generates femtosecond laser pulses (about 100 fs) at a repetition rate of about 80.7 MHz and a central wavelength at about 800 nm. The laser pulse is split into pump and probe beams. The pump beam passes through an electro-optic modulator (EOM) with a sine-wave modulation up to about 20 MHz and then through a bismuth triborate (BIBO) crystal, where its frequency is doubled to a wavelength of about 400 nm. The modulated pump beam heats up the sample surface, creating a sharp temperature rise. The transient temperature decay is monitored by the probe beam, which is delayed with a mechanical delay stage for a sub-picosecond resolution of the temperature decay. The thermal conductivity of a sample is extracted by measuring changes in its reflectance signal with a photodetector connected to a lock-in amplifier. The lock-in amplifier transmits in-phase ($V_{in}$) and out-phase ($V_{out}$) reflectance signals. A thin aluminum (Al) film (about 100 nm) was deposited on top of the sample surface for thermal transduction. The thickness of the Al film was verified by picosecond pulse-echo measurements. Sensitivity analysis is performed to optimize the experimental conditions and ensure the measurement accuracy for high thermal conductivity materials. Ten experimental measurements are plotted together in FIG. 8.

A description of the modeling analysis to extract thermal conductivity is provided below. For each measurement, measurement is made of the root-mean-square (RMS) diameter ($1/e^2$ diameter) of the pump and probe beams by using the beam offset method. The pump beam was swept by a piezo-mirror mount with a step resolution of about 0.7 µrad, which corresponds to about 2 nm. The in-phase signal is used to fit the Gaussian distribution of the laser spot.

The measured signal from the linear time invariant system in the lock-in amplifier is expressed as:

$$Z(\omega_0) = R \sum_{N=-\infty}^{\infty} H(\omega_0 + N\omega_s) \exp(iN\omega_s \tau) \qquad (E1)$$

where R is the constant which includes the thermoreflectance coefficient, the electronics gain. The N, $\omega_0$, $\omega_s$, and $\tau$ are the integer, modulation frequency, probe frequency, and time delay. The real part in equation E1, or the in-phase signal, $\text{Re}[Z(\omega_0)]$, is related to the temperature response from the sample at short delay times. On the other hand, the out-of-phase signal, or the imaginary part of equation E1, $\text{Im}[Z(\omega_0)]$, is proportional to the imaginary temperature oscillation.

The transient heat conduction model in cylindrical coordinates is expressed as:

$$\rho C_p \frac{\partial T}{\partial t} = \frac{\kappa}{r} \frac{\partial}{\partial r}\left(r \frac{\partial T}{\partial r}\right) + \kappa \frac{\partial^2 T}{\partial z^2} \qquad (E2)$$

After Hankel transform and Fourier transform, equation (E2) becomes:

$$\rho C_p i f \ \overline{T}(\omega) + \kappa k^2 \overline{T}(\omega) = \kappa \frac{\partial^2 \overline{T}(\omega)}{\partial z^2} \qquad (E3)$$

where $\rho$, $C_p$, and $\kappa$ are the mass density, specific heat, and thermal conductivity, respectively.

Rearrangement of equation E3 leads to:

$$\frac{\partial^2 \overline{T}(\omega)}{\partial z^2} = \beta^2 \overline{T}(\omega) \qquad (E4)$$

Thus $\beta$ is specified as:

$$\beta \equiv \frac{\rho C_p i \omega + \kappa k^2}{\kappa} \qquad (E5)$$

The thermal response of a sample in a given frequency domain is expressed as:

$$\begin{pmatrix} T_b \\ q_b \end{pmatrix} = \begin{pmatrix} \cosh(\beta d) & -\frac{1}{\kappa \beta} \sinh(\beta d) \\ -\kappa \beta \sinh(\beta d) & \cosh(\beta d) \end{pmatrix} \begin{pmatrix} T_t \\ q_t \end{pmatrix} \qquad (E6)$$

where $T_b$, $T_t$, $q_b$, and $q_t$ are temperatures of bottom and top sides, heat flux of bottom and top side, and d is the layer thickness. For multi-layers:

$$\begin{pmatrix} T_b \\ q_b \end{pmatrix} = K_n K_{n-1} K_{n-2} \ldots K_1 \begin{pmatrix} T_t \\ q_t \end{pmatrix} = \begin{pmatrix} a_{11} & a_{12} \\ a_{21} & a_{22} \end{pmatrix} \begin{pmatrix} T_t \\ q_t \end{pmatrix} \qquad (E7)$$

In the semi-infinite n-th layer:

$$T_t = -\frac{a_{22}}{a_{21}} q_t \qquad (E8)$$

Heat flux at the top boundary surface is expressed by the Hankel transform of the Gaussian distribution of the beam spot which is:

$$q_t = \frac{A_0}{2\pi} \exp\left(\frac{-k^2 w^2}{8}\right) \qquad (E9)$$

where $A_0$ and w are the laser power and radius of beam. By taking the inverse Hankel transform of equation (E8) with the weight average by co-axial probe beam, the frequency domain solution of H in equation E1 is expressed as:

$$H(\omega) = \frac{A}{2\pi} \int_0^\infty \frac{-a_{22}}{a_{21}} \exp\left(-\frac{k^2(w_{pump}^2 + w_{probe}^2)}{8}\right) k\, dk \qquad (E10)$$

Specific Heat Measurement

Figure 7:
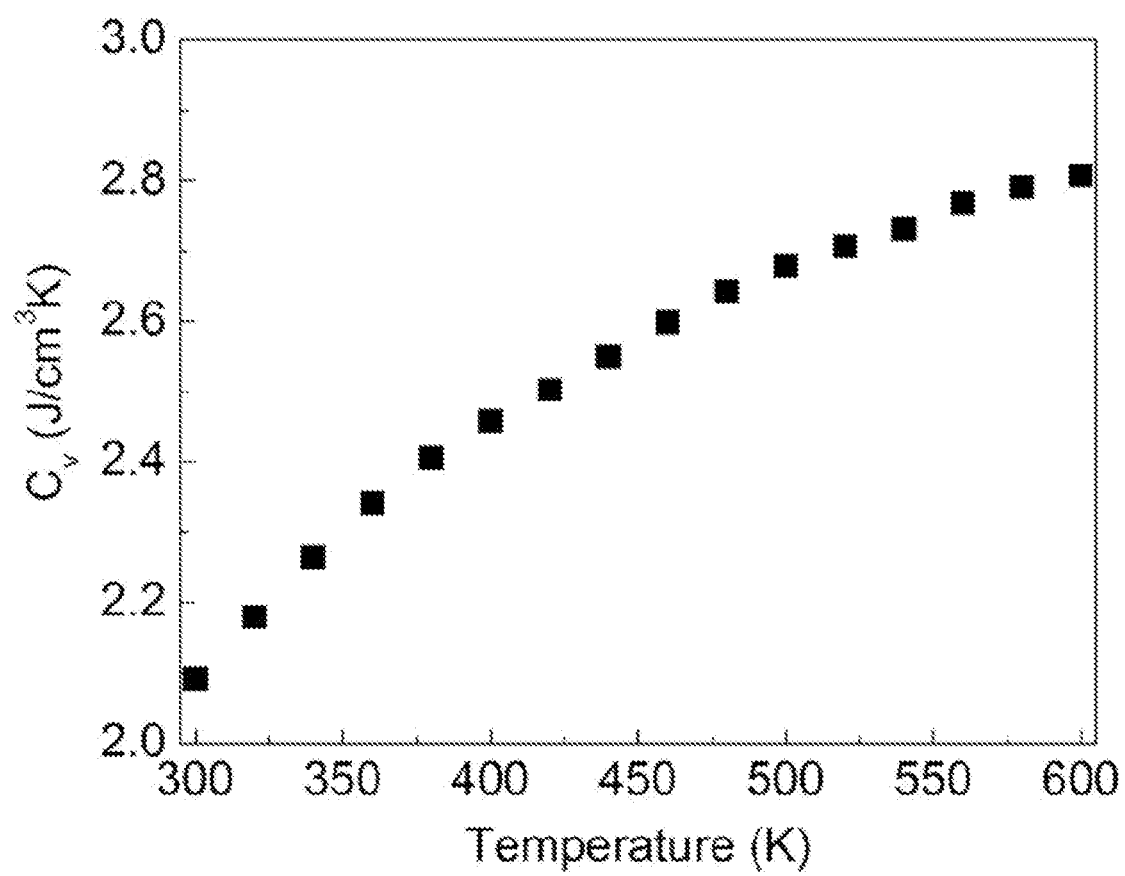
FIG. 7. Temperature-dependent volumetric heat capacity of BAs.

The specific heat of boron arsenide was measured using differential scanning calorimetry (PerkinElmer DSC 8000)

across the temperature range from about 300 K to about 600 K. The two furnaces and the StepScan mode of this machine allow the precise specific heat measurement. During each measurement, there are two crimped aluminum pans scanned across the desired temperature range, in one of which the sample was loaded while the other one was empty. The difference of heat flux through the two pans is used to calculate the thermal energy to elevate the temperature of the boron arsenide sample. Before each measurement run, a background run was performed in advance to eliminate the measurement errors of heat flux brought by the system itself. The DSC machine was calibrated with aluminum first. The temperature scanning is first performed with the heating rate of about 10 K/min, temperature interval of about 10 K and thermalization time of about 1 min under the nitrogen purge flow rate of about 20 mL/min. FIG. 7 shows the temperature-dependent volumetric heat capacity of BAs.

Figure 3F:
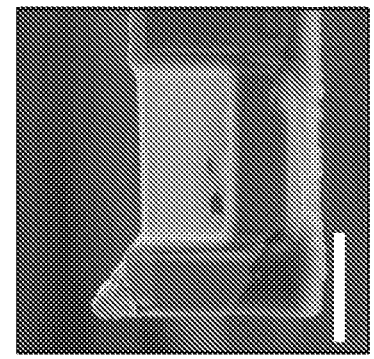
Figure 3G:
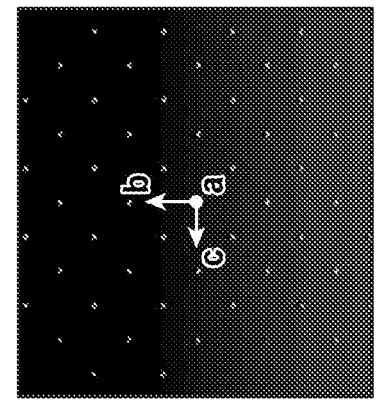
Figure 3H:
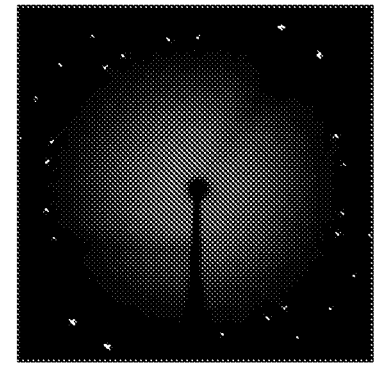

For mass density, experimental measurement is made of the lattice constant of BAs sample to be about 4.78 Å using single crystal X-ray diffraction (FIG. 3f and FIG. 6). Considering the crystal structure and unit cell volume, the mass density is obtained as about 5.214 g/cm$^3$.

Crystal Stability of BAs

To evaluate the stabilities of BAs crystals, measurement is made of the thermal conductivity of the BAs crystal after about 10 months from its growth. The sample is kept in the atmosphere condition (about 300 K, about 1 atm, and about 60% relative humidity). It is found that there is no observable degradation in the thermal conductivity of BAs, indicating that BAs crystal is stable in the air up to about 10 months. Furthermore, temperature stability of the BAs crystal is confirmed. The crystal is heated up to about 600 K in the vacuum and cooled down to room temperature. The temperature cycle is repeated twice and the measured thermal conductivity remains the same. These results indicate that BAs crystal is stable under these conditions.

Ab Initio Calculation to Evaluate the Effect of Point Defects

Ab initio calculation is performed to consider the effect of arsenic vacancy defects at different temperatures (T). The nonequilibrium phonon distribution function $n_\lambda$ under an applied temperature gradient can be described by the Boltzmann transport equation (BTE) as:

$$v_\lambda \cdot \nabla T \frac{\partial n_\lambda}{\partial T} = \left(\frac{\partial n_\lambda}{\partial t}\right)_{collisions} \tag{E11}$$

where $\lambda \equiv (q, p)$ labels the phonon mode with wave vector q and polarization p, and $v_\lambda$ is the phonon group velocity. In Eq. (E11), the phonon drift due to temperature gradient on the left side is balanced by the phonon scattering on the right side. The scattering term on the right side of the equation includes intrinsic phonon-phonon scattering and phonon-isotope/defect scattering:

$$\left(\frac{\partial n_\lambda}{\partial t}\right)_{collisions} = \left(\frac{\partial n_\lambda}{\partial t}\right)_{intrinsic} + \left(\frac{\partial n_\lambda}{\partial t}\right)_{defect} \tag{E12}$$

For phonon scattering due to isotopes or point defects, a perturbation to Hamiltonian due to mass disorder is considered. Using Fermi's golden rule, the phonon-isotope/defect scattering term in BTE is expressed as:

$$\left(\frac{\partial n_\lambda}{\partial t}\right)_{defect} = \frac{\pi}{2N}\omega_\lambda^2 \Sigma_{\lambda'}\delta(\omega_\lambda - \omega_{\lambda'}) \tag{E13}$$

$$\Sigma_b g(b)|e_\lambda^*(b)\cdot e_\lambda(b)|^2[n_\lambda(n_{\lambda'}+1) - n_{\lambda'}(n_\lambda + 1)]$$

where $\omega_\lambda$ is the angular frequency of phonon mode $\lambda$, $e_\lambda(b)$ is the vibrational eigenvector of the $b^{th}$ atom in unit cell and phonon mode $\lambda$, and N is the number of unit cells in the crystal. g(b) is a factor that describes the mass variance of the $b^{th}$ atom in unit cell:

$$g(b) = \Sigma_i f_i(b)\left[1 - \frac{M_i(b)}{\overline{M}(b)}\right]^2 \tag{E14}$$

where $f_i(b)$ and $M_i(b)$ are the fraction and the atomic mass of the $i^{th}$ isotope of the $b^{th}$ atom respectively, and $\overline{M}(bb)$ is the average atomic mass of the element of the $b^{th}$ atom. Arsenic vacancies are treated as an isotope to arsenic with zero mass. In this method, the changes of interatomic potential are ignored, whose influence to lattice thermal conductivity is negligible at low vacancy concentration (<about 0.01%). For the calculation of FIG. 4d in this example, a vacancy concentration of about 0.002% is used to match the calculated thermal conductivity with the measured value at room temperature. The calculated curve (dashed line, FIG. 4d) represents the prediction of temperature-dependent thermal conductivity when three-phonon process and defect scattering dominate the thermal transport (e.g., four-phonon process is negligible).

According to Eq. (E13), the isotope scattering term is determined by nonequilibrium phonon distribution function $n_\lambda$. Similarly, using Fermi's golden rule, phonon-phonon intrinsic scattering term considering three-phonon process can be expressed as a function of nonequilibrium phonon distribution function and third-order interatomic force constants. Hence, the unknown $n_\lambda$ is on both sides of the BTE. To calculate the thermal conductivity of various materials, a single mode relaxation time approximation (RTA) is usually applied to derive the phonon lifetime time, and subsequently the thermal conductivity can be derived from kinetic theory. Within the single mode RTA, the phonon distribution for mode $\lambda$' in Eq. (E13) (or mode $\lambda$' and $\lambda$'' for three phonon process) follows the equilibrium Bose-Einstein distribution, and a perturbation is given to mode $\lambda$, so that one can compute the phonon lifetime for mode $\lambda$ by BTE. However, the single mode RTA approximation can underestimate the thermal conductivity for high thermal conductivity materials such as graphene and diamond. This is due to inaccurate treatment of the normal phonon-phonon scattering process and the breakdown of the local equilibrium for materials with small phonon scattering rates. Therefore, instead of RTA, the iterative solution of BTE is used here to calculate the thermal conductivity of BAs. For a small temperature gradient ($\nabla T$), the nonequilibrium phonon distribution $n_\lambda$ can be linearly expanded as $$n_\lambda n_\lambda^0 + (-\partial n_\lambda^0/\partial T)F_\lambda \cdot \nabla T,$$

where $n_\lambda^0$ is the Bose-Einstein distribution under equilibrium state. $F_\lambda$ can be derived by iteratively solving the BTE. The lattice thermal conductivity tensor $\kappa^{\alpha\beta}$ can be calculated by summing over all the phonon modes in first Brillouin zone:

$$\kappa^{\alpha\beta} = \frac{1}{k_B T^2 \Omega N} \Sigma_\lambda n_0(n_0+1)(\hbar\omega_\lambda)^2 v_\lambda^\alpha F_\lambda^\beta \quad \text{(E15)}$$

where h is the Plank constant over $2\pi$, and $\Omega$ is the volume of the unit cell. Here, the first Brillouin zone is discretized by a 28×28×28 q mesh. $v_\lambda^\alpha$ is the group velocity of phonon mode $\lambda$ along direction $\alpha$, which can be calculated from phonon dispersion relation:

$$v_\lambda^\alpha = \frac{\partial \omega}{\partial q^\alpha} \quad \text{(E16)}$$

where $q^\alpha$ is the wave vector along direction $\alpha$.

Calculation is performed of the second and third order interatomic force constants (IFCs). Second-order IFCs are involved for deriving phonon dispersion relation. Second-order IFCs are obtained based on density functional theory (DFT) and density functional perturbation theory (DFPT) using Quantum ESPRESSO package respectively. In self-consistent calculations of electronic structure using plane-wave basis, norm-conserving pseudopotentials under local density approximation are used for both boron and arsenic. The kinetic energy cutoff for electronic wavefunctions was set as 80 Ry. The lattice constant of BAs is determined by minimizing the total energy of the system in ground-state. After self-consistent calculations of electronic structure, DFPT was applied to obtain the second-order IFCs. For both DFT and DFPT calculations, 6×6×6 Monkhorst-Pack k-points meshes are used. Third-order IFCs are involved for three phonon process of the intrinsic phonon-phonon scattering. The third-order IFCs were obtained from a 4×4×4 supercell with 128 atoms, using finite displacement method in real space. Up to fifth nearest neighbors were considered. A package thirdorder.py was used to generate an irreducible set of displacements and then extract third order IFCs from the forces acting on atoms under each displacement. The forces acting on atoms was calculated by DFT. After obtaining the IFCs, the lattice thermal conductivity was computed using ShengBTE package.

As used herein, the singular terms "a," "an," and "the" may include plural referents unless the context clearly dictates otherwise. Thus, for example, reference to an object may include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "connect," "connected," and "connection" refer to an operational coupling or linking. Connected objects can be directly coupled to one another or can be indirectly coupled to one another, such as via one or more other objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be "substantially" or "about" the same as a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a range of about 1 to about 200 should be understood to include the explicitly recited limits of about 1 and about 200, but also to include individual values such as about 2, about 3, and about 4, and sub-ranges such as about 10 to about 50, about 20 to about 100, and so forth.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, operation or operations, to the objective, spirit and scope of the disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not a limitation of the disclosure.

What is claimed is:

1. A device comprising:
    a boron arsenide substrate; consisting essentially of a single-crystalline boron arsenide material; and
    an integrated circuit disposed in or over, and in direct thermal contact with, the boron arsenide material or the boron arsenide substrate,
    wherein the boron arsenide material has a thermal conductivity of 1400 W/m·K or less at room temperature.

2. The device of claim 1, wherein the boron arsenide material is substantially single-crystalline or low defects.

3. The device of claim 1, wherein the boron arsenide material has a thermal conductivity of up to 1400 W/m·K at room temperature.

4. The device of claim 1, wherein the boron arsenide material has a thermal conductivity of 1000 W/m·K to 1400 W/m·K at room temperature.

5. The device of claim 1, wherein the integrated circuit includes boron arsenide.

6. A device comprising:

an active or passive component;

a heat sink; and a thermal interface material disposed between the active or passive component and the heat sink, the thermal interface material being in direct thermal contact with the active or passive component and including boron arsenide that is single-crystalline.

7. The device of claim 6, wherein the boron arsenide is in the form of particles.

8. The device of claim 7, wherein the particles have sizes in a range of 1 nm to 1000 nm, or in a range of 1 μm to about 1000 μm.

9. The device of claim 7, wherein the thermal interface material further includes a polymer, and the particles are dispersed in the polymer.

10. The device of claim 6, wherein the boron arsenide is substantially defect free.

11. The device of claim 6, wherein the active or passive component includes boron arsenide.

12. A method of forming boron arsenide, comprising:

providing a growth substrate;

preparing high purity and solid powders of a first precursor including boron, and a second precursor including arsenic; and exposing the growth substrate to the solid powders of the first and second precursors in a reaction furnace to yield epitaxial growth of boron arsenide over the growth substrate.

13. The method of claim 12, wherein the growth substrate includes a boron compound.

14. The method of claim 12, wherein the growth substrate is a boron phosphide substrate.

15. The method of claim 12, wherein the boron arsenide is single-crystalline.

16. An electronic, optoelectronic, or photonic device having a cooling substrate comprising single-crystalline boron arsenide, wherein the single-crystalline boron arsenide has a thermal conductivity of 1400 W/m·K or less at room temperature.

17. The device of claim 16, wherein the single-crystalline boron arsenide is substantially defect free.

18. The device of claim 16, wherein the single-crystalline boron arsenide has a thermal conductivity of 1000 W/m·K or greater at room temperature.

* * * * *